(12) United States Patent
Tseng et al.

(10) Patent No.: US 9,997,628 B1
(45) Date of Patent: Jun. 12, 2018

(54) SEMICONDUCTOR DEVICE AND METHOD OF FABRICATING THEREOF

(71) Applicant: TAIWAN SEMICONDUCTOR MANUFACTURING CO., LTD., Hsinchu (TW)

(72) Inventors: Hsin-Hsiang Tseng, Changhua County (TW); Jheng-Hong Jiang, Hsinchu (TW); Fu-Cheng Chang, Tainan (TW); Ching-Hung Kao, Tainan (TW); Hsin-Chi Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/486,616

(22) Filed: Apr. 13, 2017

(51) Int. Cl.
*H01L 29/78* (2006.01)
*H01L 21/82* (2006.01)
*H01L 29/49* (2006.01)
*H01L 29/10* (2006.01)
*H01L 21/8238* (2006.01)
*H01L 29/66* (2006.01)
*H01L 27/092* (2006.01)

(52) U.S. Cl.
CPC .. *H01L 29/7833* (2013.01); *H01L 21/823814* (2013.01); *H01L 21/823842* (2013.01); *H01L 27/092* (2013.01); *H01L 29/1033* (2013.01); *H01L 29/4916* (2013.01); *H01L 29/66492* (2013.01)

(58) Field of Classification Search
None
See application file for complete search history.

(56) References Cited

U.S. PATENT DOCUMENTS 5,393,676 A * 2/1995 Anjum ............ H01L 21/28052
257/E21.199
5,620,922 A * 4/1997 Yoshida ............ H01L 21/82384
257/350

* cited by examiner

*Primary Examiner* — Seahvosh Nikmanesh
(74) *Attorney, Agent, or Firm* — McClure, Qualey & Rodack, LLP

(57) ABSTRACT

The present disclosure provides a semiconductor device and a method of fabricating the semiconductor device. In some embodiments, the semiconductor device includes a substrate having a well region, a first source/drain region, a second source/drain region, a buried channel and a gate structure. The first source/drain region is located within the well region. The gate structure includes a co-doped gate including polysilicon and having a first concentration of a n-type impurity and a second concentration of a p-type impurity, in which the n-type impurity and the p-type impurity are mixed and distributed.

20 Claims, 11 Drawing Sheets

SEMICONDUCTOR DEVICE AND METHOD OF FABRICATING THEREOF

BACKGROUND

Semiconductor manufacturers face a constant challenge to comply with Moore's Law. They constantly strive to continually decrease feature sizes, such as active and passive devices, interconnecting wire widths and thicknesses and power consumption as well as to increase device density, wire density and operating frequencies.

Generally, a buried channel disposed in a metal oxide semiconductor (MOS) device is developed to overcome a problem of random telegraph signal (RTS). However, a higher concentration and a deeper depth of the buried channel may lead to problems such as current leakage and an uncontrollable threshold voltage. To overcome the problems, the circuit of a logic area in the device needs to be modified to match a new design of the buried channel.

Therefore, there is a need to develop a semiconductor device and a method of fabricating the semiconductor device to tackle the aforementioned problems without greatly changing the original circuit design of the device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
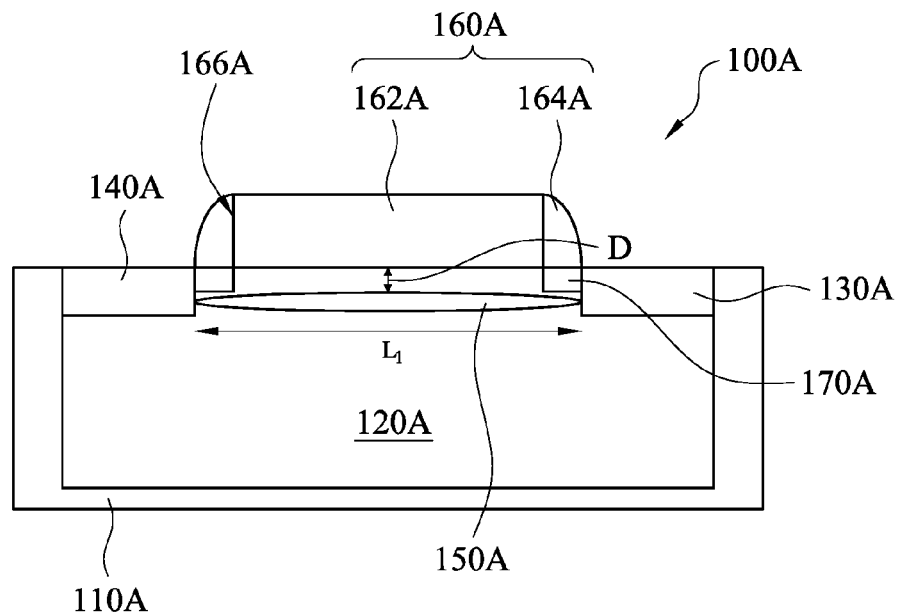
FIG. 1A is a schematic cross-sectional view of a semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are directed to providing a semiconductor device and a method of fabricating the semiconductor device, in which the semiconductor device has a buried channel and a co-doped gate, thereby keeping a low threshold voltage ($V_t$), a low on-resistance ($R_{on}$) and a high saturation current ($I_{sat}$) while decreasing a random telegraph signal (RTS). The method of the present disclosure may be applied to a n-type metal oxide semiconductor (NMOS) device, a p-type metal oxide semiconductor (PMOS) device, or a complementary metal oxide semiconductor (CMOS) device, and operations of forming the co-doped gate may be performed in the same stage (NMOS or PMOS) or in different stages (CMOS), in which a mask used to form a source/drain region of a type of a MOS device (e.g. a NMOS device or a PMOS device) of the CMOS is simultaneously used to form the co-doped gate of the opposite type (e.g. a PMOS device or a NMOS device) of a MOS device of the CMOS, thereby reducing a cost of fabricating a new mask. In addition, semiconductor devices having different width/length ratio (W/L) may be fabricated by the method of the present disclosure.

FIG. 1A illustrates a schematic cross-sectional view of a semiconductor device 100A in accordance with various embodiments of the present disclosure. In FIG. 1A, the semiconductor device 100A includes a substrate 110A having a well region 120A, a first source/drain region 130A within the well region 120A, a second source/drain region 140A within the well region 120A and opposite to the first source/drain region 130A, a buried channel 150A and a gate structure 160A, in which the buried channel 150A is located within the well region 120A and between the first source/drain region 130A and the second source/drain region 140A, and the gate structure 160A is disposed above the buried channel 150A and located between the first source/drain region 130A and the second source/drain region 140A. The gate structure 160A includes a co-doped gate 162A, and may further include a spacer 164A disposed on a sidewall 166A of the co-doped gate 162A. The co-doped gate 162A includes polysilicon and has a first concentration of a n-type impurity and a second concentration of a p-type impurity, in which the n-type impurity and the p-type impurity in the co-doped gate 162A are mixed and distributed.

In some embodiments, the substrate 110A includes a crystalline silicon substrate (e.g., wafer), doped or undoped. In other embodiments, the substrate 110A may be made of some other suitable semiconductors, such as gallium arsenide, silicon carbide, indium arsenide, indium phosphide, silicon germanium carbide, gallium arsenic phosphide, or gallium indium phosphide. In yet other embodiments, the substrate 110A may be a silicon-on-insulator (SOI) structure.

In an embodiment, the well region 120A may include a p-doped silicon, doped using, for example, boron or other suitable acceptor dopants to form a body of an NMOS device. In an embodiment, the well region 120A has a dopant concentration of between about $1\times10^{15}$ cm$^{-3}$ and about $1\times10^{16}$ cm$^{-3}$. In other embodiments, suitable dopants may be selected to form a PMOS device.

In some embodiments, the first source/drain region 130A and the second source/drain region 140A may be doped with n-type dopants, e.g., phosphorous or the like, to form a NMOS device, or p-type dopants, e.g., boron or the like, to form a PMOS device. In an embodiment, the first source/drain region 130A and the second source/drain region 140A may have dopant concentrations between about $1\times10^{22}$ cm$^{-3}$ and about $3\times10^{22}$ cm$^{-3}$. In yet embodiments, the semiconductor device 100A may further include lightly-doped drain regions 170A adjacent to the first source/drain region 130A and the second source/drain region 140A.

In some embodiments, the buried channel 150A is doped with a n-type dopant when the semiconductor device 100A is a NMOS device. In another embodiment, the buried channel 150A is doped with a p-type dopant when the semiconductor device 100A is a PMOS device. In some embodiments, the dopant concentration of the buried channel 150A is in a range substantially from $1\times10^{10}$ cm$^{-3}$ to $1\times10^{14}$ cm$^{-3}$. When the dopant concentration of the buried channel 150A is smaller than $1\times10^{10}$ cm$^{-3}$, problems such as high RTS are likely to occur. On the other hand, when the dopant concentration of the buried channel 150A is greater than $1\times10^{14}$ cm$^{-3}$, a defect such as current leakage are likely to occur. In some embodiments, a length $L_1$ of the buried channel 150A is equal to a distance between the first source/drain region 130A and the second source/drain region 140A.

In some embodiments, the n-type impurity of the co-doped gate 162A includes arsenic (As), phosphorous (P), antimony (Sb) or a combination thereof. In another embodiment, the p-type impurity of the co-doped gate 162A includes boron (B), boron difluoride (BF$_2$) or a combination thereof. In some embodiments, the first concentration of the n-type impurity is substantially the same as the second concentration of the p-type impurity, and thus the buried channel 150A may be a counter-doped buried channel, thereby keeping low $V_t$ and higher $I_{sat}$ but solving the problem of current leakage. In an example, the first concentration and the second concentration are respectively and substantially in a range from $1\times10^{13}$ cm$^{-3}$ to $1\times10^{18}$ cm$^{-3}$. In other embodiments, there is no upper limit for the first concentration and the second concentration, as long as the first concentration is substantially equal to the second concentration. When the first concentration and/or the second concentration is/are smaller than $1\times10^{13}$ cm$^{-3}$, RTS is likely to occur. In some embodiments, a vertical distance D between the buried channel 150A and the co-doped gate 162A is in a range substantially from 0 to 1 μm. When the vertical distance D is greater than 1 μm, problems such as current leakage are likely to occur. In some embodiments, the n-type impurity and the p-type impurity are mixed and distributed.

In some embodiments, the spacer 164A may include one or more layers formed from a dielectric material such as silicon oxide, silicon nitride, silicon carbide, silicon oxynitride, or combinations thereof.

Figure 1B:
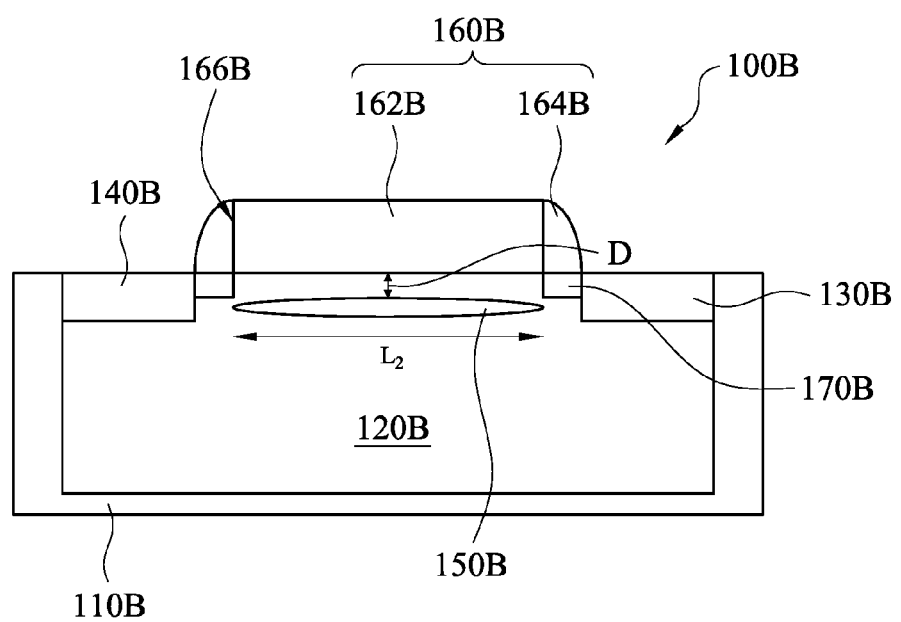
FIG. 1B is a schematic cross-sectional view of a semiconductor device in accordance with various embodiments of the present disclosure.

FIG. 1B illustrates a schematic cross-sectional view of a semiconductor device 100B in accordance with various embodiments of the present disclosure. In FIG. 1B, the semiconductor device 100B includes a substrate 110B having a well region 120B, a first source/drain region 130B within the well region 120B, a second source/drain region 140B within the well region 120B and opposite to the first source/drain region 130 B, a buried channel 150B and a gate structure 160B, in which the gate structure 160B includes a co-doped gate 162B, and may further include a spacer 164B disposed on a sidewall 166B of the co-doped gate 162B. The co-doped gate 162B includes polysilicon and has a first concentration of a n-type impurity and a second concentration of a p-type impurity, in which the n-type impurity and the p-type impurity in the co-doped gate 162B are mixed and distributed. In some embodiments, the semiconductor device 100B may further include a lightly-doped drain 170B adjacent to the source/drain region 130B and the second source/drain region 140B.

It is noted that the substrate 110B, the well region 120B, the first source/drain region 130B, the second source/drain region 140B, the buried channel 150B, the gate structure 160B and the lightly-doped drain 170B of the semiconductor device 100B are similar to the substrate 110A, the well region 120A, the first source/drain region 130A, the second source/drain region 140A, the buried channel 150A, the gate structure 160A and the lightly-doped drain 170A of the semiconductor device 100A.

In some embodiments, a length $L_2$ of the buried channel 150B is smaller than a distance between the first source/drain region 130B, the second source/drain region 140B. For example, the length $L_2$ may be one third of the distance between the first source/drain region 130B and the second source/drain region 140B, however, the present disclosure is not limited to the example. Furthermore, the buried channel 150B may be disposed near the first source/drain region 130B, near the second source/drain region 140B, or in the middle of the first source/drain region 130B and the second source/drain region 140B.

FIG. 2A to FIG. 2H illustrate schematic cross-sectional views of intermediate stages showing a method for fabricating a semiconductor device in accordance with various embodiments of the present disclosure. It is noted that FIG. 2A to FIG. 2H illustrate only one p-type or n-type semiconductor device such as a PMOS device or a NMOS device, so as to simplify the drawings. In fact, FIG. 2A to FIG. 2H are applicable to the fabrication of a CMOS device, meaning that either a complementary PMOS or NMOS device is omitted from the figures. The complementary PMOS or NMOS device can be fabricated by similar operations disclosed in FIG. 2A to FIG. 2H.

Figure 2A:
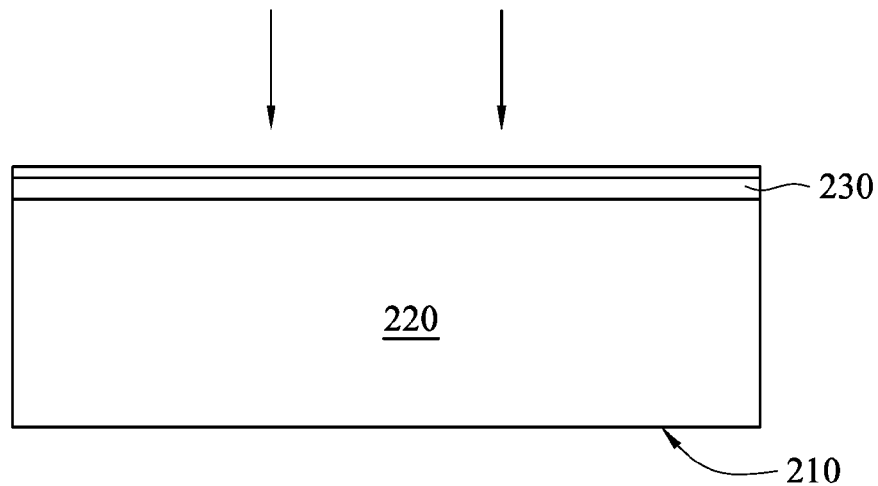
FIG. 2A to FIG. 2H are schematic cross-sectional views of intermediate stages showing a method for fabricating a semiconductor device in accordance with various embodiments of the present disclosure.

Referring to FIG. 2A, a substrate 210 is provided and is doped with a first impurity to form a well region 220. In some embodiments, the substrate 210 includes a crystalline silicon substrate (e.g., wafer), doped or undoped. In other embodiments, the substrate 210 may be made of some other suitable semiconductors, such as gallium arsenide, silicon carbide, indium arsenide, indium phosphide, silicon germanium carbide, gallium arsenic phosphide, or gallium indium phosphide. In yet other embodiments, the substrate 210 may be a silicon-on-insulator (SOI) structure. It is noted that the remaining portion of the substrate 210 except that the well region 220 is not shown to simplify the drawings. In some embodiments, the well region 220 may include a p-doped silicon, doped using, for example, boron or other suitable acceptor dopants to form a body of an NMOS device. In other embodiments, suitable dopants may be selected to form a PMOS device. In an embodiment, the well region 220 has a dopant concentration of between about $1\times10^{15}$ cm$^{-3}$ and about $1\times10^{16}$ cm$^{-3}$.

Then, a buried channel 230 is formed by doping a second impurity in a first portion of the well region 220. In some embodiments, ion implantation is performed to form the buried channel 230, and the second impurity is a n-type dopant such as phosphorus, arsenic or other suitable donor dopants when a NMOS device is desired, and the second impurity is a p-type dopant such as boron or other suitable acceptor dopants when a PMOS device is desired. In some embodiment, a concentration of the second impurity in the buried channel 230 is in a range substantially from $1 \times 10^{10}$ $cm^{-3}$ to $1 \times 10^{14}$ $cm^{-3}$. When the concentration of the second impurity of the buried channel 230 is smaller than $1 \times 10^{10}$ $cm^{-3}$, problems such as high RTS are likely to occur. On the other hand, when the concentration of the second impurity of the buried channel 230 is greater than $1 \times 10^{14}$ $cm^{-3}$, a defect such as current leakage is likely to occur.

Figure 2B:
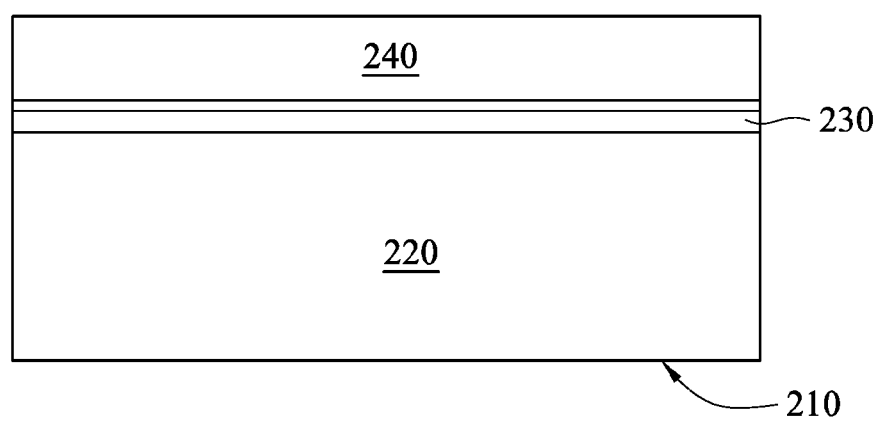
Figure 2C:
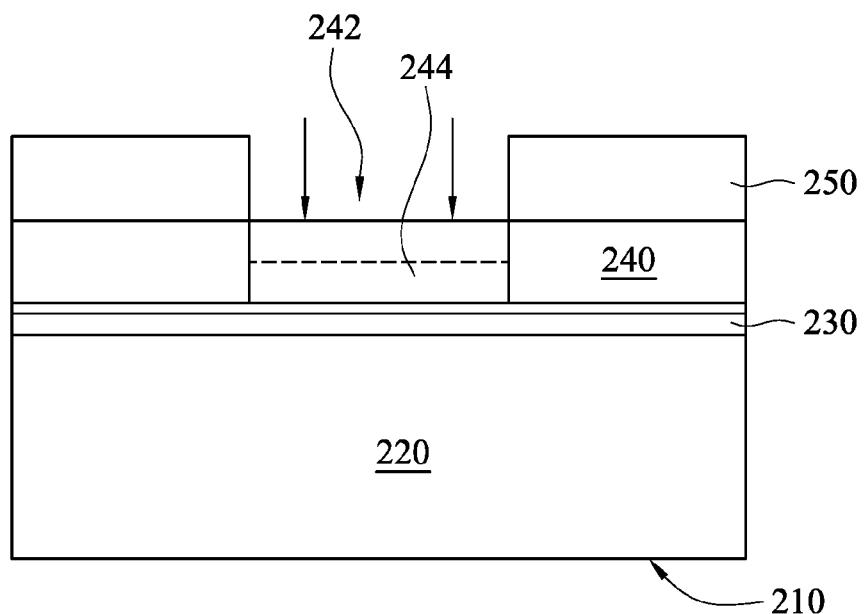

Next, as shown in FIG. 2B, a polysilicon layer 240 is deposited on a surface of the substrate and above the buried channel 230. In some embodiments, the polysilicon layer 240 is then used to form a gate structure in the proceeding process. Then, as shown in FIG. 2C, a gate layer 242 of the polysilicon layer 240 is doped by a third impurity by using a mask 250. In some embodiments, operations for forming of the mask 250 include formation of a photoresist layer, a photolithography process, a developing process, or other suitable processes. In some embodiments, the third impurity includes As, P, Sb or a combination thereof. In other embodiments, the third impurity includes B, $BF_2$ or a combination thereof. In some embodiments, a concentration of the third impurity of the gate layer 242 is in a range substantially from $1 \times 10^{13}$ $cm^{-3}$ to $1 \times 10^{18}$ $cm^{-3}$. In some example, impurity profiles may have Gaussian shapes in the gate layer 242, and a region 244 of the gate layer 242 has the concentration of the third impurity in a range substantially from $1 \times 10^{13}$ $cm^{-3}$ to $1 \times 10^{18}$ $cm^{-3}$, in which the region 244 is defined from the bottom (near the well region 220) of the gate layer 242 to one half of a thickness of the gate layer 242.

Figure 2D:
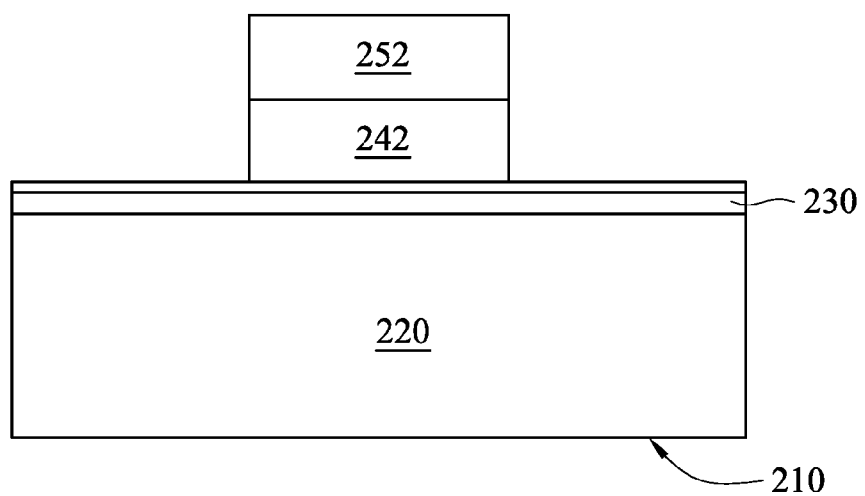

Afterward, as shown in FIG. 2D, the mask 250 is removed, and the other portion (except for the gate layer 242) of the polysilicon layer 240 is removed by using a mask 252. In some embodiments, a wet etching process or a dry etching process may be performed to remove the other portion of the polysilicon layer 240.

Figure 2E:
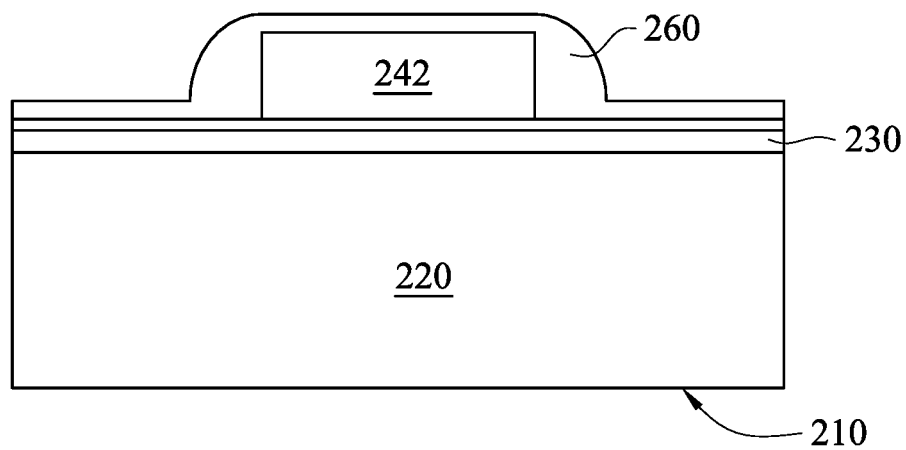

Next, as shown in FIG. 2E, the mask 252 is removed and a dielectric layer 260 is deposited over the gate layer 242 and on a surface of the substrate 210. A material of the dielectric layer 260 may include silicon oxide, silicon nitride, silicon carbide, silicon oxynitride, or combinations thereof.

Figure 2F:
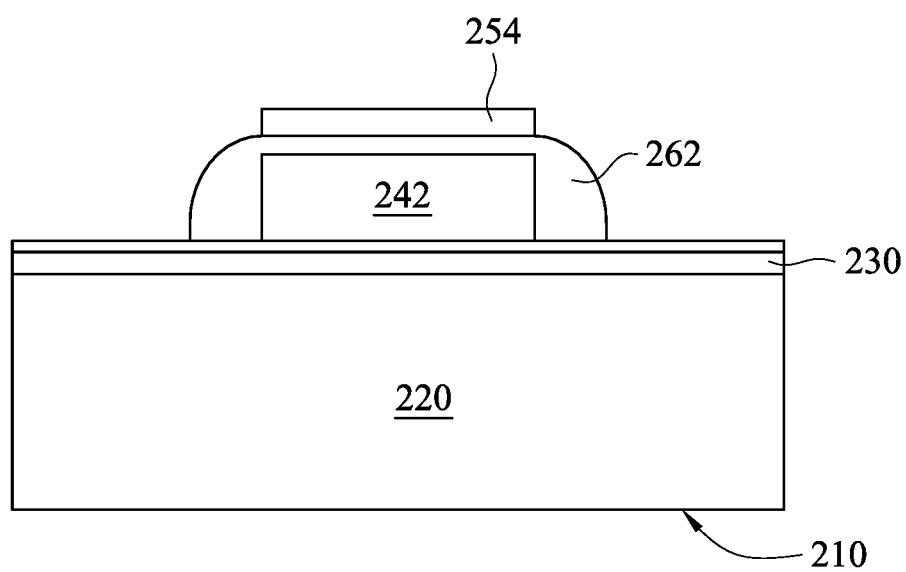

In FIG. 2F, the dielectric layer 260 is etched by using a mask 254, thereby forming a gate structure, in which the gate structure includes the gate layer 242 and a spacer 262 on a sidewall of the gate layer 242. In some embodiments, the spacer 262 is formed by anisotropically etching the dielectric layer 260. The mask 254 is then removed, and a planarization process such as chemical mechanical polishing (CMP) may be performed to remove the spacer 262 on a top surface of the gate layer 242.

Figure 2G:
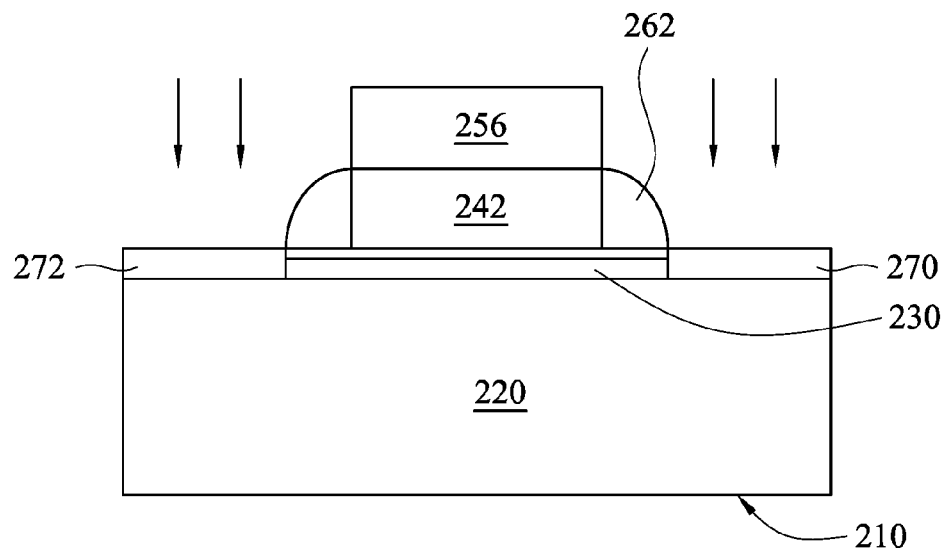

In FIG. 2G, a first source/drain region 270 and a second source/drain region 272 are formed by doping a second portion of the well region 220 with a fourth impurity using a mask 256. In some embodiments, the fourth impurity may be n-type dopants, such as phosphorous or the like, to form a NMOS device. In other embodiments, the fourth impurity may be p-type dopants, for example, boron or the like, to form a PMOS device. In some embodiments, a concentration of the fourth impurity in the first source/drain region 270 and the second source/drain region 272 may be respectively and substantially in a range from $1 \times 10^{22}$ $cm^{-3}$ and about $3 \times 10^{22}$ $cm^{-3}$. In some embodiments, multiple doping processes may be utilized to create a desired doping profile, including, for example, lightly-doped drain (LDD) regions (not shown) and the like. It is noted that the spacer 262 may be exposed from the mask 256 or protected by the mask 256 when the doping process is performed, the present disclosure is not limited to the illustrated embodiment. In some embodiments, the first source/drain region 270 and the second source/drain region 272 may be overlapped with the buried channel 230, that is, a length of the buried channel is equal to a distance between the first source/drain region 270 and the second source/drain region 272. In other embodiments, the buried channel are independently disposed between the first source/drain region 270 and the second source/drain region 272, that is, a length of the buried channel 230 is smaller than a distance between the first source/drain region 270 and the second source/drain region 272.

Figure 2H:
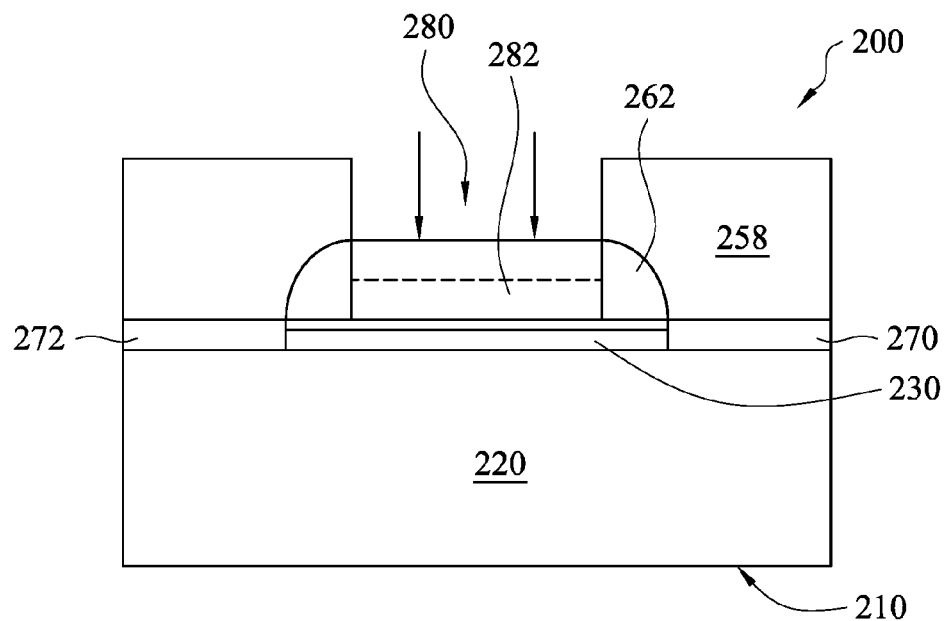

Then, as shown in FIG. 2H, the mask 256 is removed and the gate layer 242 is doped with a fifth impurity using a mask 258, thereby forming a first semiconductor device 200 on the substrate 210, in which the first semiconductor device 200 has a co-doped gate 280. The fifth impurity is an opposite type to the third impurity, and the third impurity as well as the fifth impurity are mixed and distributed. In some embodiments, a concentration of the third impurity of is substantially the same as a concentration of the fifth impurity in the co-doped gate 280, and thus the buried channel 230 may be a counter-doped buried channel, thereby keeping low $V_t$ and higher $I_{sat}$ but solving the problem of current leakage. In some embodiments, the fifth impurity includes B, $BF_2$ or a combination thereof. In other embodiments, the fifth impurity includes As, P, Sb or a combination thereof. In some embodiments, a concentration of the fifth impurity of co-doped gate 280 is in a range substantially from $1 \times 10^{13}$ $cm^{-3}$ to $1 \times 10^{18}$ $cm^{-3}$. In other embodiments, there is no upper limit for the concentration of the third impurity and the concentration of the fifth impurity, as long as the concentration of the third impurity is substantially equal to the concentration of the fifth impurity. When the concentration of the third impurity and/or the concentration of the fifth impurity is/are smaller than $1 \times 10^{13}$ $cm^{-3}$, RTS is likely to occur. In some example, impurity profiles may have Gaussian shapes in the co-doped gate 280, and a region 282 of the co-doped gate 280 has the concentration of the fifth impurity in a range substantially from $1 \times 10^{13}$ $cm^{-3}$ to $1 \times 10^{18}$ $cm^{-3}$, in which the region 282 is defined from the bottom (near the well region 220) of the co-doped gate 280 to one half of a thickness of the co-doped gate 280.

In some embodiments, the first impurity and the fifth impurity comprise a same type of impurity, and the second impurity, the third impurity and the fourth impurity comprise a same type of impurity opposite to the first impurity and the fifth impurity.

In some embodiments, a vertical distance between the buried channel 230 and the co-doped gate 280 is in a range substantially from 0 to 1 µm. When the vertical distance is greater than 1 µm, problems such as current leakage are likely to occur.

In some embodiments, when the semiconductor device is a CMOS device, the semiconductor device further comprises a second semiconductor device (not shown) having an opposite type to the first semiconductor device 200 (i.e. when the first semiconductor device 200 is a NMOS device, and the second semiconductor device is a PMOS device). In the embodiment, the method further comprises using a same mask (e.g. the mask 258) to simultaneously doping the gate layer 242 of the first semiconductor device 200 with the fifth impurity and forming source/drain regions of the second semiconductor device (not shown).

FIG. 3A to FIG. 3H illustrate schematic cross-sectional views of intermediate stages showing a method for fabricating a semiconductor device in accordance with various embodiments of the present disclosure. It is noted that a process shown by FIG. 3A to FIG. 3H is suitable for fabricating a NMOS device or a PMOS device.

Figure 3A:
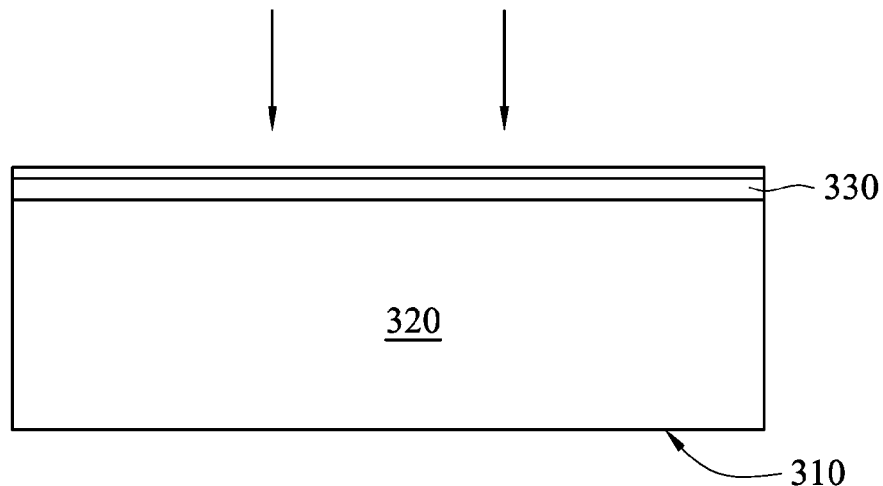
FIG. 3A to FIG. 3H are schematic cross-sectional views of intermediate stages showing a method for fabricating a semiconductor device in accordance with various embodiments of the present disclosure.

Referring to FIG. 3A, a substrate 310 is provided and is doped with a first impurity to form a well region 320. In some embodiments, the substrate 310 includes a crystalline silicon substrate (e.g., wafer), doped or undoped. In other embodiments, the substrate 310A may be made of some other suitable semiconductors, such as gallium arsenide, silicon carbide, indium arsenide, indium phosphide, silicon germanium carbide, gallium arsenic phosphide, or gallium indium phosphide. In yet other embodiments, the substrate 310 may be a silicon-on-insulator (SOI) structure. It is noted that the remaining portion of the substrate 310 except for the well region 320 is not illustrated to simplify the figures. In some embodiments, the well region 320 may include a p-doped silicon, doped using, for example, boron or other suitable acceptor dopants to form a body of an NMOS device. In other embodiments, suitable dopants may be selected to form a PMOS device. In an embodiment, the well region 320 has a dopant concentration of between about $1 \times 10^{15}$ cm$^{-3}$ and about $1 \times 10^{16}$ cm$^{-3}$.

Then, a buried channel 330 is formed by doping a second impurity in a first portion of the well region 320. In some embodiments, ion implantation is performed to form the buried channel 330, and the second impurity is a n-type dopant such as phosphorus, arsenic or other suitable donor dopants when a NMOS device is desired, and the second impurity is a p-type dopant such as boron or other suitable acceptor dopants when a PMOS device is desired. In some embodiment, a concentration of the second impurity in the buried channel 330 is in a range substantially from $1 \times 10^{10}$ cm$^{-3}$ to $1 \times 10^{14}$ cm$^{-3}$. When the concentration of the second impurity of the buried channel 330 is smaller than $1 \times 10^{10}$ cm$^{-3}$, problems such as high RTS are likely to occur. On the other hand, when the concentration of the second impurity of the buried channel 330 is greater than $1 \times 10^{14}$ cm$^{-3}$, a defect such as current leakage is likely to occur.

Figure 3B:
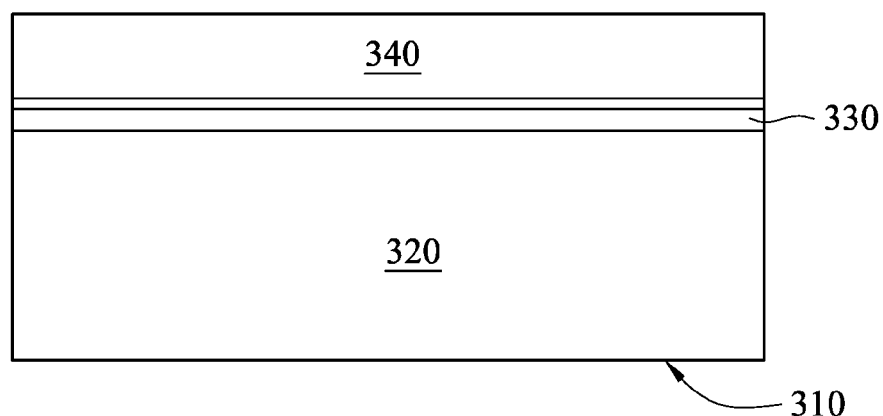

Next, as shown in FIG. 3B, a polysilicon layer 340 is deposited on a surface of the substrate and above the buried channel 330. In some embodiments, the polysilicon layer 340 is then used to form a gate structure in the proceeding process.

Figure 3C:
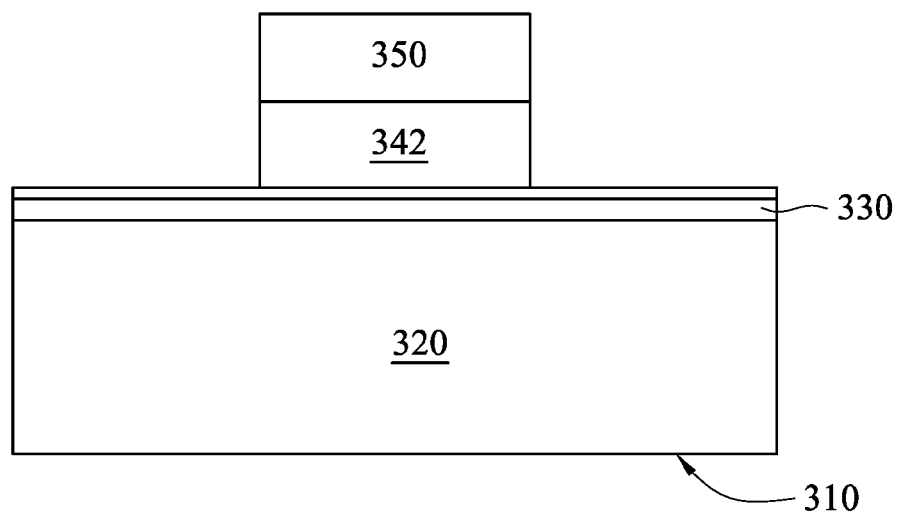

Afterward, as shown in FIG. 3C, a gate layer 342 of the polysilicon layer 340 is remained and the other portion of the polysilicon layer 340 is removed by using a mask 350. In some embodiments, operations for forming of the mask 350 include formation of a photoresist layer, a photolithography process, a developing process, or other suitable processes. In some embodiments, a wet etching process or a dry etching process may be performed to remove the other portion of the polysilicon layer 340.

Figure 3D:
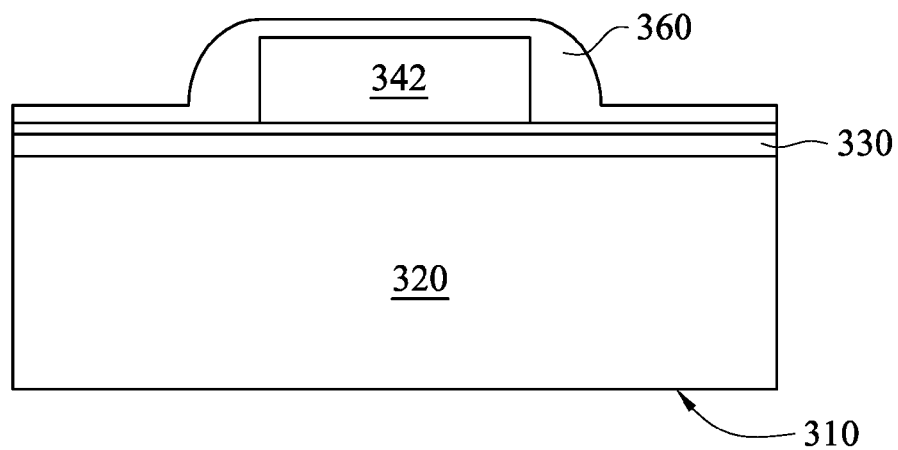

Next, as shown in FIG. 3D, the mask 350 is removed and a dielectric layer 360 is deposited over the gate layer 342 and on a surface of the substrate 310. A material of the dielectric layer 360 may include silicon oxide, silicon nitride, silicon carbide, silicon oxynitride, or combinations thereof.

Figure 3E:
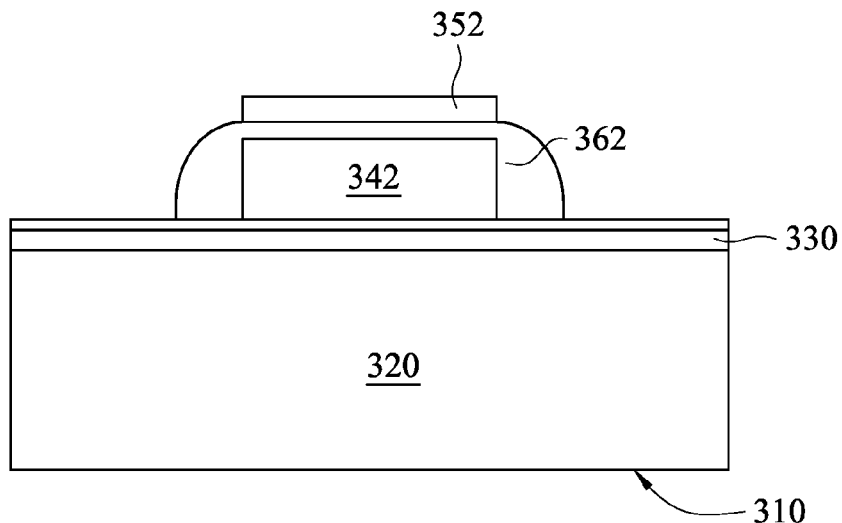

In FIG. 3E, the dielectric layer 360 is etched by using a mask 352, thereby forming a gate structure include the gate layer 342 and a spacer 362 on a sidewall of the gate layer 342. In some embodiments, the spacer 362 is formed by anisotropically etching the dielectric layer 360. The mask 352 is then removed, and a planarization process such as chemical mechanical polishing (CMP) may be performed to remove the spacer 362 on a top surface of the gate layer 342.

Figure 3F:
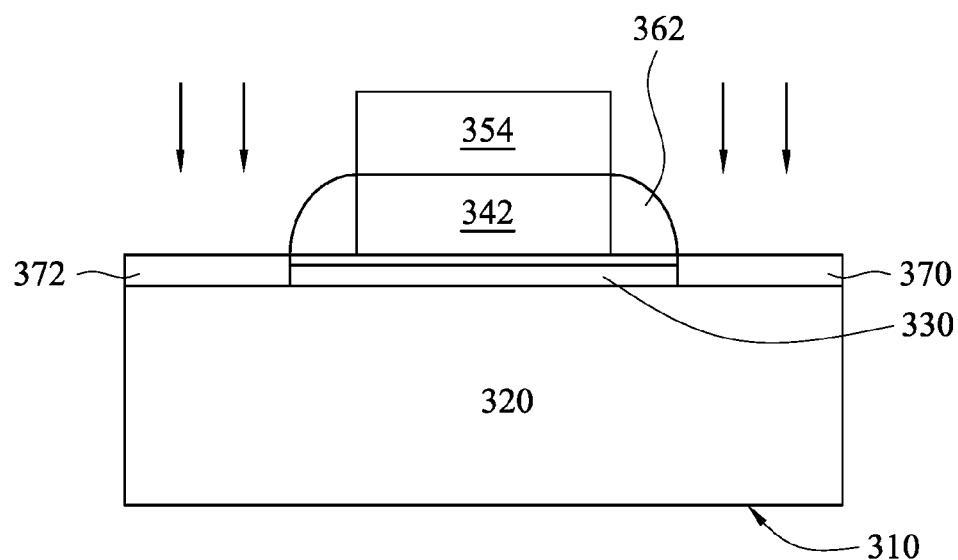

In FIG. 3F, a first source/drain region 370 and a second source/drain region 372 are formed by doping a second portion of the well region 320 with a third impurity using a mask 354. In some embodiments, the third impurity may be n-type dopants, such as phosphorous or the like, to form an NMOS device. In other embodiments, the third impurity may be p-type dopants, for example, boron or the like, to form a PMOS device. In some embodiments, a concentration of the third impurity in the first source/drain region 370 and the second source/drain region 372 may be respectively and substantially in a range from $1 \times 10^{22}$ cm$^{-3}$ and about $3 \times 10^{22}$ cm$^{-3}$. In some embodiments, multiple doping processes may be utilized to create a desired doping profile, including, for example, lightly-doped drain (LDD) regions (not shown) and the like. It is noted that the spacer 362 may be exposed from the mask 354 or protected by the mask 354 when the doping process is performed, the present disclosure is not limited to the illustrated embodiment. In some embodiments, the first source/drain region 370 and the second source/drain region 372 may be overlapped with the buried channel 330, that is, a length of the buried channel is equal to a distance between the first source/drain region 370 and the second source/drain region 372. In other embodiments, the buried channel are independently disposed between the first source/drain region 370 and the second source/drain region 372, that is, a length of the buried channel 330 is smaller than a distance between the first source/drain region 370 and the second source/drain region 372.

Figure 3G:
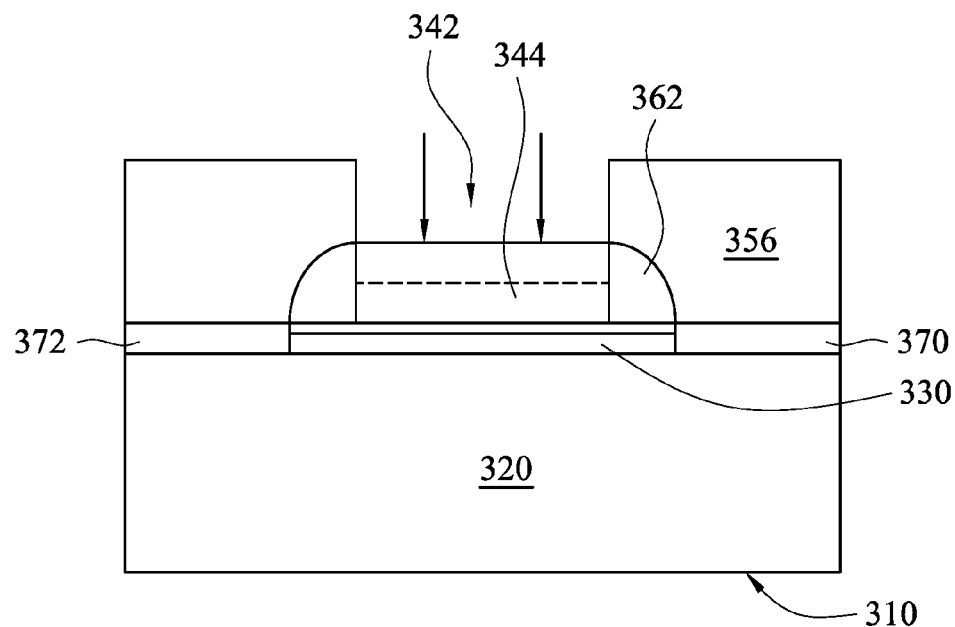
Figure 3H:
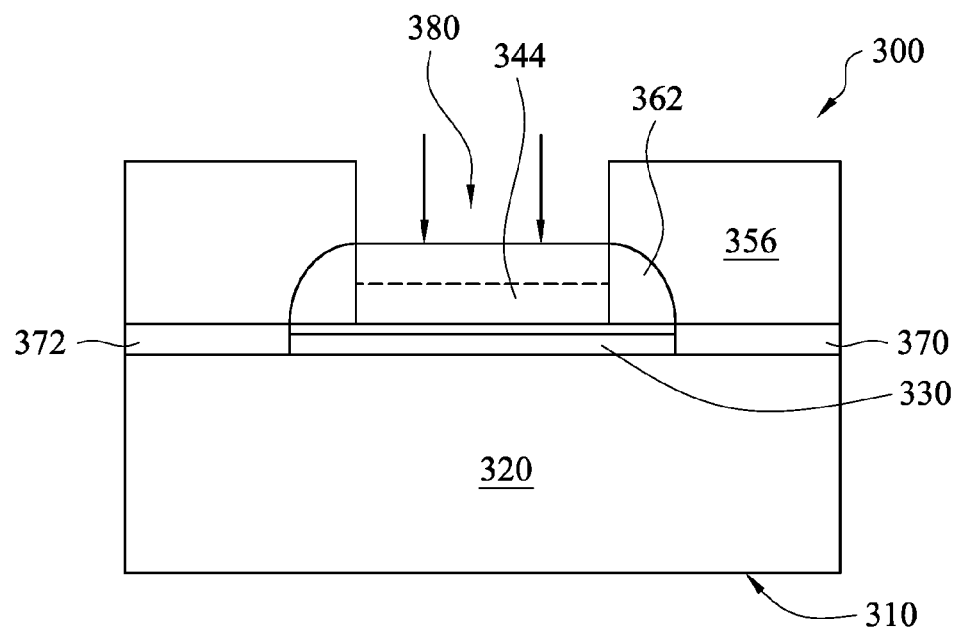

Then, as shown in FIG. 3G, the gate layer 342 is doped with a fourth impurity by using a mask 356. Next, as shown in FIG. 3H, the gate layer 342 is doped with a fifth impurity using the mask 356, thereby forming a co-doped gate 380 of a semiconductor device 300. The fifth impurity is an opposite type to the fourth impurity, and the fourth impurity as well as the fifth impurity are mixed and distributed. In some embodiments, a concentration of the fourth impurity of is substantially the same as a concentration of the fifth impurity in the co-doped gate 380, and thus the buried channel 330 may be a counter-doped buried channel, thereby keeping low $V_t$ and higher $I_{sat}$ but solving the problem of current leakage. In some embodiments, the fourth impurity includes As, P, Sb or a combination thereof, and the fifth impurity includes B, BF$_2$ or a combination thereof. In other embodiments, the fourth impurity includes B, BF$_2$ or a combination thereof, and the fifth impurity includes As, P, Sb or a combination thereof. In some embodiments, concentrations of the fourth impurity and the fifth impurity of the gate layer 342 are respectively and substantially in a range from $1 \times 10^{13}$ cm$^{-3}$ to $1 \times 10^{18}$ cm$^{-3}$. In other embodiments, there is no upper limit for the concentration of the fourth impurity and the concentration of the fifth impurity, as long as the concentration of the fourth impurity is substantially equal to the concentration of the fifth impurity. When the concentration of the fourth impurity and/or the concentration of the fifth impurity is/are smaller than $1 \times 10^{13}$ cm$^{-3}$, RTS is likely to occur. In some example, impurity profiles may have Gaussian shapes in the gate layer 342 (or the co-doped gate 380), and a region 344 of the gate layer 342 (or the co-doped gate 380) has the respective concentrations of the fourth impurity and the fifth impurity in a range substantially from $1 \times 10^{13}$ cm$^{-3}$ to $1 \times 10^{18}$ cm$^{-3}$, in which the region 344 is defined from the bottom (near the well region 320) of the gate layer 342 (or the co-doped gate 380) to one half of a thickness of the gate layer 342 (or the co-doped gate 380).

In some embodiments, operation of respectively doping the gate layer 342 with the fourth impurity and the fifth impurity may be performed between operations of forming the gate structure and doping the second portion of the well region 320.

In some embodiments, a vertical distance between the buried channel 330 and the co-doped gate 380 is in a range substantially from 0 to 1 μm. When the vertical distance is greater than 1 μm, problems such as current leakage are likely to occur.

In a certain embodiments, when width/length ratio (W/L) of the co-doped gate 160A is about 1, the $V_t$ of the semiconductor device may be in a range substantially from $5.14 \times 10^{-1}$ V to $5.17 \times 10^{-1}$ V, which is substantially equal to the $V_t$ of a known semiconductor device (the gate is composed of polysilicon, n-doped polysilicon or p-doped polysilicon) having a similar W/L but without a buried channel. However, the problems such as RTS and current leakage are overcome in the semiconductor device 100A.

The semiconductor devices of the embodiments of the present disclosure may undergo further CMOS or MOS technology processing to form various features and regions known in the art. For example, subsequent processing may form various contacts/vias/lines and multilayers interconnect features (e.g., metal layers and interlayer dielectrics) over the substrate, configured to connect the various features or structures of the semiconductor devices. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

In one example, when W/L of the co-doped gate 160A is about 36, the Vt of the semiconductor device may be in a range substantially from $5.01 \times 10^{-1}$ V to $5.05 \times 10^{-1}$ V, which is substantially equal to the $V_t$ of a known semiconductor device (the gate is composed of polysilicon, n-doped polysilicon or p-doped polysilicon) having a similar W/L but without a buried channel. However, the problems such as RTS and current leakage are overcome in the semiconductor device 100A.

In one example, when W/L of the co-doped gate 160A is about 3, the Vt of the semiconductor device may be in a range substantially from $4.75 \times 10^{-1}$ V to $4.87 \times 10^{-1}$ V, which is substantially equal to the $V_t$ of a known semiconductor device (the gate is composed of polysilicon, n-doped polysilicon or p-doped polysilicon) having a similar W/L but without a buried channel. However, the problems such as RTS and current leakage are overcome in the semiconductor device 100A.

Figure 4:
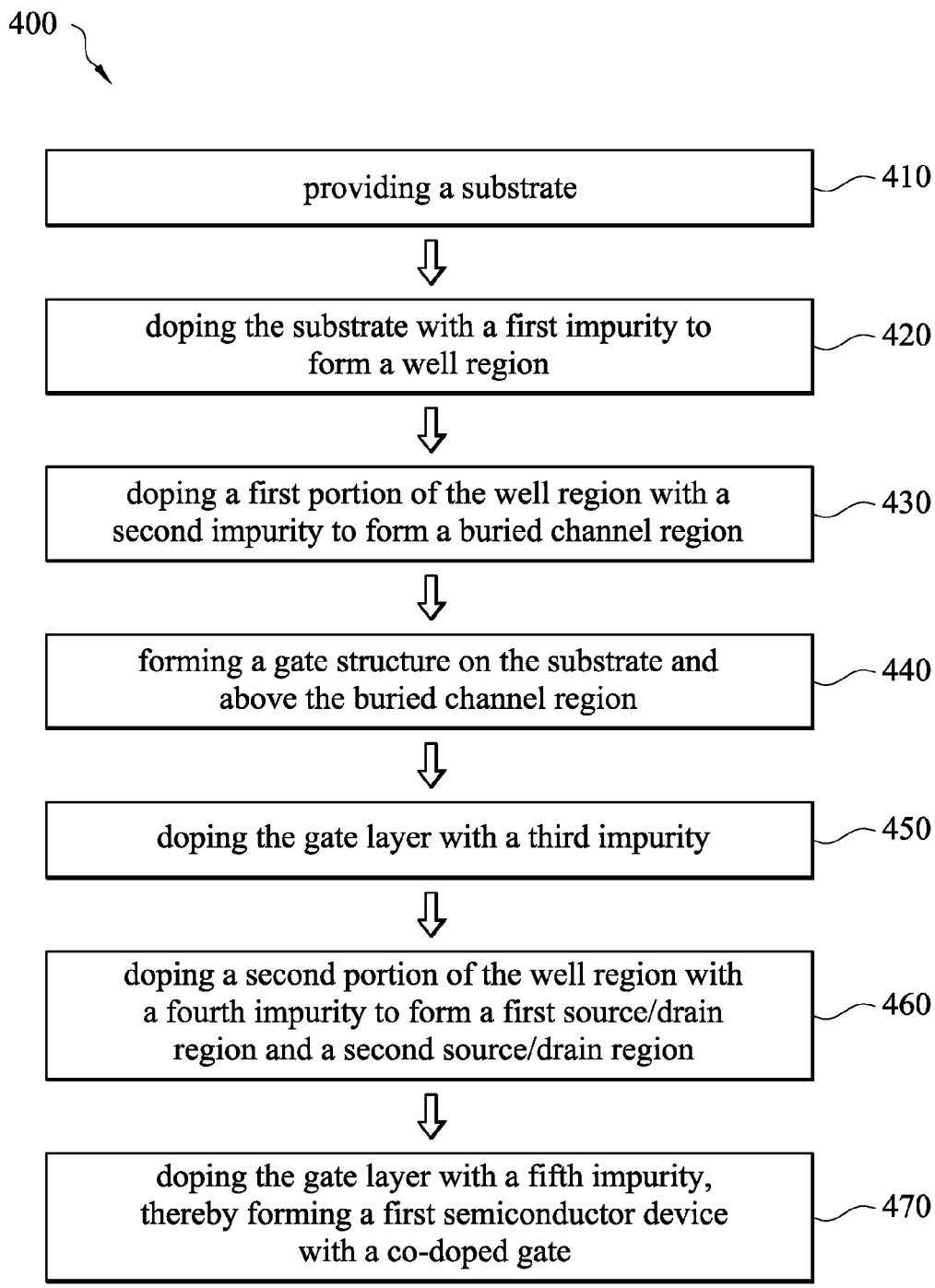
FIG. 4 is a flow chart of a method for fabricating a semiconductor device in accordance to some embodiments of the present disclosure.

FIG. 4 illustrates a flow chart of a method 400 for fabricating a semiconductor device in accordance to some embodiments of the present disclosure. The method 400 is described in relation to FIG. 2A to FIG. 2H.

At operation 410 and operation 420, a substrate is provided first, and the substrate is doped with a first impurity to form a well region, shown as the substrate 210 and the well region 220 of FIG. 2A.

At operation 430, a first portion of the well region is doped with a second impurity to form a buried channel region (e.g. the buried channel 230 of FIG. 2B).

At operation 440, a gate structure is formed on the substrate and above the buried channel (e.g. the gate structure including the gate layer 242 of the polysilicon layer 240 and the spacer 262 of FIG. 2B to FIG. 2F).

At operation 450, the gate layer is doped with a third impurity (e.g. the gate layer 242 of FIG. 2C).

At operation 460, a second portion of the well region is doped with a fourth impurity to form a first source/drain region and a second source/drain region (e.g. the first source/drain region 270 and the second source/drain region 272 of FIG. 2G).

At operation 470, the gate layer is doped with a fifth impurity, thereby forming a first semiconductor device with a co-doped gate (e.g. the co-doped gate 280 of FIG. 2H).

Figure 5:
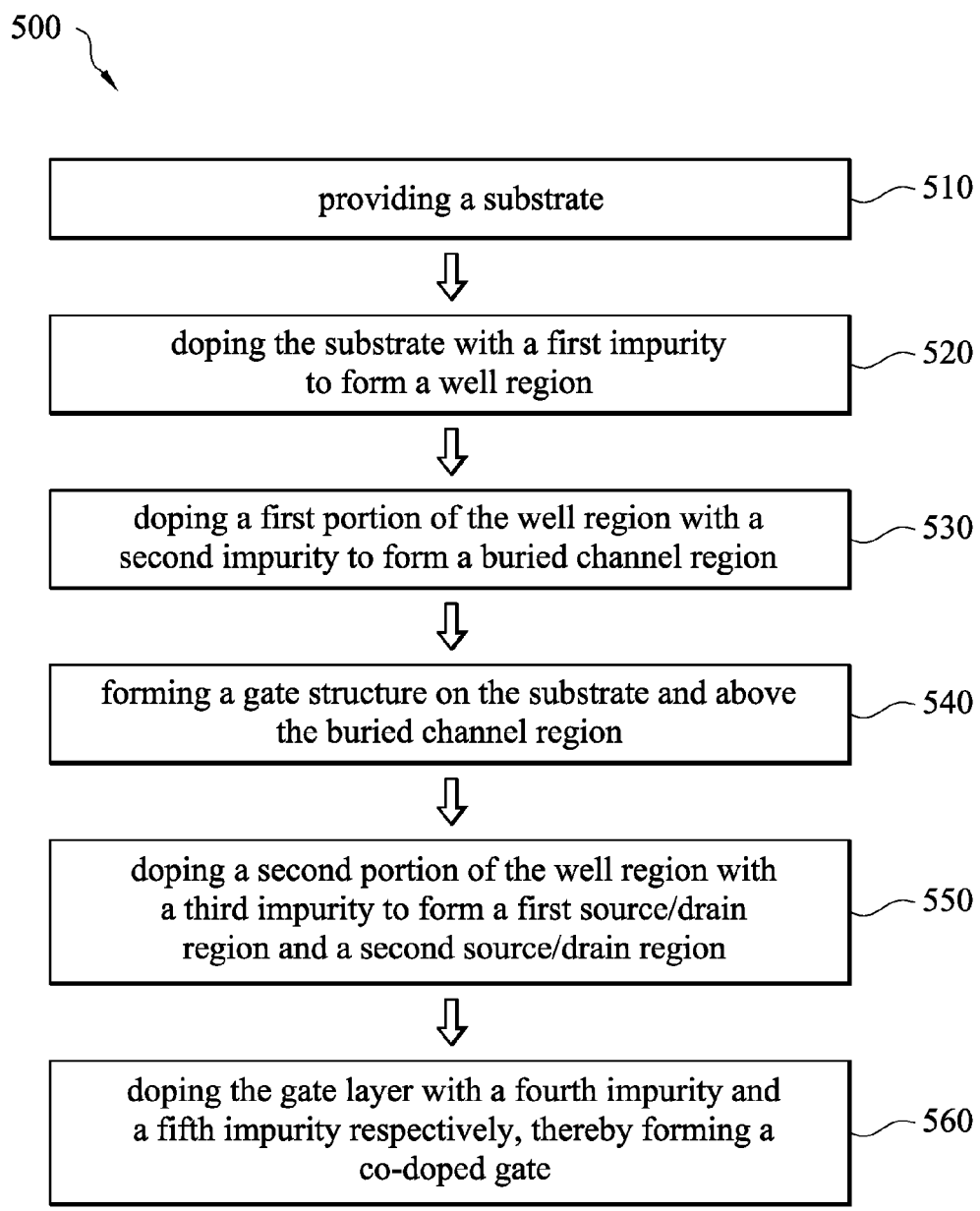
FIG. 5 is a flow chart of a method for fabricating a semiconductor device in accordance to some embodiments of the present disclosure.

FIG. 5 illustrates a flow chart of a method 500 for fabricating a semiconductor device in accordance to some embodiments of the present disclosure. The method 500 is described in relation to FIG. 3A to FIG. 3H.

At operation 510 and operation 520, a substrate is provided first, and the substrate is doped with a first impurity to form a well region, shown as the substrate 510 and the well region 520 of FIG. 3A.

At operation 530, a first portion of the well region is doped with a second impurity to form a buried channel region (e.g. the buried channel 330 of FIG. 3B).

At operation 540, a gate structure is formed on the substrate and above the buried channel (e.g. the gate structure including the gate layer 342 of the polysilicon layer 340 and the spacer 362 of FIG. 3B to FIG. 3E).

At operation 550, a second portion of the well region is doped with a third impurity to form a first source/drain region and a second source/drain region (e.g. the first source/drain region 370 and the second source/drain region 372 of FIG. 3F).

At operation 560, the gate layer is doped with a fourth impurity and a fifth impurity (e.g. the gate layer 342 of FIG. 3G and the co-doped gate 380 of FIG. 3H).

The present disclosure provides a semiconductor device and a method of fabricating thereof. The semiconductor of the present disclosure has a buried channel and a co-doped gate (doped by both a n-type dopant and a p-type dopant), thereby keeping a low threshold voltage, a low on-resistance and a high saturation current while lowering down random telegraphy signals and current leakage. In addition, the method of the present disclosure may be applied to fabricate a NMOS device, a PMOS device or a CMOS device, and operations of forming the co-doped gate may be performed in the same stage (NMOS or PMOS) or in different stages (CMOS), in which a mask used to form a source/drain region of one type of a MOS device of the CMOS is simultaneously used to form the co-doped gate of another type of a MOS device of the CMOS, thereby reducing a cost of fabricating a new mask. Besides, applying the semiconductor device and a method of fabricating the semiconductor device of the present disclosure, only a source follower may be replaced without largely changing the logic circuit of the semiconductor device, and thus the process for fabricating the semiconductor device is substantially simplified.

In some embodiments, a semiconductor device is provided. The semiconductor device includes a substrate having a well region, a first source/drain region, a second source/drain region, a buried channel and a gate structure. The first source/drain region is located within the well region. The second source/drain region is located within the well region and opposite to the first source/drain region. The buried channel is located within the well region and between the first source/drain region and the second source/drain region. The gate structure is disposed above the buried channel and located between the first source/drain region and the second source/drain region. The gate structure includes a co-doped gate including polysilicon and having a first concentration of a n-type impurity and a second concentration of a p-type impurity, in which the n-type impurity and the p-type impurity are mixed and distributed.

In some embodiments, a method of fabricating a semiconductor device is provided. First, a substrate is provided. Then, the substrate is doped with a first impurity to form a well region. Next, a first portion of the well region is doped with a second impurity to form a buried channel region. Afterwards, a gate structure on the substrate and above the buried channel region, in which the gate structure comprises a gate layer on the substrate. Then, the gate layer is doped with a third impurity. Next, a second portion of the well region is doped with a fourth impurity to form a first source/drain region and a second source/drain region, in which the buried channel region is located between the first source/drain region and the second source/drain region. Then, the gate layer is doped with a fifth impurity, thereby forming a first semiconductor device with a co-doped gate, in which the third impurity and the fifth impurity are mixed and distributed. The first impurity and the fifth impurity comprise a same type of impurity, and the second impurity, the third impurity and the fourth impurity comprise a same type of impurity opposite to the first impurity and the fifth impurity.

In some embodiments, a method of fabricating a semiconductor device is provided. First, a substrate is provided. Then, the substrate is doped with a first impurity to form a well region. Next, a first portion of the well region is doped with a second impurity to form a buried channel region. Afterwards, a gate structure on the substrate and above the buried channel region, in which the gate structure comprises a gate layer on the substrate. Then, a second portion of the well region is doped with a third impurity to form a first source/drain region and a second source/drain region, in which the buried channel region is located between the first source/drain region and the second source/drain region. Next, the gate layer is doped with a fourth impurity and a fifth impurity respectively, thereby forming a co-doped gate, in which the fourth impurity and the fifth impurity are mixed and distributed. The fifth impurity is an opposite type of impurity to the fourth impurity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
    providing a substrate;
    doping the substrate with a first impurity to form a well region;
    doping a first portion of the well region with a second impurity to form a buried channel region;
    forming a gate structure on the substrate and above the buried channel region, wherein the gate structure comprises a gate layer on the substrate;
    doping the gate layer with a third impurity;
    doping a second portion of the well region with a fourth impurity to form a first source/drain region and a second source/drain region, wherein the buried channel region is located between the first source/drain region and the second source/drain region; and
    doping the gate layer with a fifth impurity, thereby forming a first semiconductor device with a co-doped gate, wherein the third impurity and the fifth impurity are mixed and distributed,
    wherein the first impurity and the fifth impurity comprise a same type of impurity, and the second impurity, the third impurity and the fourth impurity comprise a same type of impurity opposite to the first impurity and the fifth impurity.

2. The method of claim 1, wherein the semiconductor device is a complementary metal oxide semiconductor (CMOS) device, and the semiconductor device further comprises a second semiconductor device having an opposite type to the first semiconductor device, and
    wherein the method further comprises using a same mask to simultaneously doping the gate layer of the first semiconductor device with the fifth impurity, and forming source/drain regions of the second semiconductor device.

3. The method of claim 1, wherein a concentration of the third impurity of is substantially the same as a concentration of the fifth impurity in the co-doped gate.

4. The method of claim 1, wherein the third impurity or the fifth impurity comprises arsenic (As), phosphorous (P), antimony (Sb) or a combination thereof.

5. The method of claim 1, wherein the third impurity or the fifth impurity comprises boron (B), boron difluoride ($BF_2$) or a combination thereof.

6. The method of claim 1, wherein a concentration of the second impurity is in a range substantially from $1\times10^{10}$ cm$^{-3}$ to $1\times10^{14}$ cm$^{-3}$.

7. The method of claim 1, wherein a vertical distance between the buried channel and the co-doped gate is in a range substantially from 0 to 1 μm.

8. A method of fabricating a semiconductor device, comprising:
    providing a substrate;
    doping the substrate with a first impurity to form a well region;
    doping a first portion of the well region with a second impurity to form a buried channel region;
    forming a gate structure on the substrate and above the buried channel region, wherein the gate structure comprises a gate layer on the substrate;
    doping a second portion of the well region with a third impurity to form a first source/drain region and a second source/drain region, wherein the buried channel region is located between the first source/drain region and the second source/drain region; and
    doping the gate layer with a fourth impurity and a fifth impurity respectively, thereby forming a co-doped gate, wherein the fourth impurity and the fifth impurity are mixed and distributed,
    wherein the fifth impurity is an opposite type of impurity to the fourth impurity.

9. The method of claim 8, wherein the semiconductor device is a p-type metal oxide semiconductor (PMOS) device or a n-type metal oxide semiconductor (NMOS) device.

10. The method of claim 8, wherein doping the gate layer with the fourth impurity and the fifth impurity respectively is performed between forming the gate structure and doping the second portion of the well region.

11. The method of claim 8, wherein the fourth impurity or the fifth impurity comprises arsenic (As), phosphorous (P), antimony (Sb) or a combination thereof.

12. The method of claim 8, wherein the fourth impurity or the fifth impurity comprises boron (B), boron difluoride ($BF_2$) or a combination thereof.

13. The method of claim 1, wherein the buried channel has a length equal to a distance between the first source/drain region and the second source/drain region.

14. The method of claim 1, wherein the buried channel has a length smaller than a distance between the first source/drain region and the second source/drain region.

15. The method of claim 8, wherein a concentration of the second impurity is in a range substantially from $1 \times 10^{10}$ cm$^{-3}$ to $1 \times 10^{14}$ cm$^{-3}$.

16. The method of claim 8, wherein the fourth impurity and the fifth impurity are doped into the gate layer by separate operations.

17. The method of claim 8, wherein forming the gate structure on the substrate and above the buried channel region comprises:
   depositing polysilicon layer on the substrate;
   removing a portion of the polysilicon layer; and
   forming a spacer on a sidewall of the remaining polysilicon layer.

18. A method of fabricating a semiconductor device, the method comprising:
   providing a substrate;
   doping the substrate with a first impurity to form a well region;
   doping a first portion of the well region with a second impurity to form a buried channel region;
   depositing a polysilicon layer on the substrate and above the buried channel region;
   doping a portion of the polysilicon layer with a third impurity, thereby defining a gate layer of a gate structure;
   removing the other portion of the polysilicon layer;
   forming a spacer on a sidewall of the gate layer, thereby forming the gate structure;
   doping a second portion of the well region with a fourth impurity to form a first source/drain region and a second source/drain region, wherein the buried channel region is located between the first source/drain region and the second source/drain region; and
   doping the gate layer with a fifth impurity, thereby forming a co-doped gate, wherein the third impurity and the fifth impurity are mixed and distributed in a region of the co-doped gate, and the region is defined from a bottom of the gate layer to one half of a thickness of the gate layer,
   wherein the fifth impurity is an opposite type of impurity to the fourth impurity.

19. The method of claim 18, wherein the first impurity and the fifth impurity comprise a same type of impurity, and the second impurity, the third impurity and the fourth impurity comprise a same type of impurity opposite to the first impurity and the fifth impurity.

20. The method of claim 18, wherein a concentration of the third impurity is substantially same as a concentration of the fifth impurity in the region.

* * * * *